United States Patent
Nakayama et al.

(10) Patent No.: US 10,636,819 B2
(45) Date of Patent: Apr. 28, 2020

(54) IMAGING DEVICE AND MANUFACTURING METHOD THEREOF

(71) Applicant: NIKON CORPORATION, Tokyo (JP)

(72) Inventors: Satoshi Nakayama, Sagamihara (JP); Ryoji Ando, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/507,218

(22) Filed: Jul. 10, 2019

(65) Prior Publication Data

US 2019/0333948 A1 Oct. 31, 2019

Related U.S. Application Data

(63) Continuation of application No. PCT/JP2017/046792, filed on Dec. 26, 2017.

(30) Foreign Application Priority Data

Jan. 30, 2017 (JP) .................................. 2017-014915

(51) Int. Cl.
*H01L 27/146* (2006.01)

(52) U.S. Cl.
CPC .... *H01L 27/14603* (2013.01); *H01L 27/1463* (2013.01); *H01L 27/14643* (2013.01); *H01L 27/14683* (2013.01)

(58) Field of Classification Search
CPC ......... H01L 27/14603; H01L 27/14683; H01L 27/14643; H01L 27/1463; H01L 27/14687; H01L 27/14612; H01L 27/1461
See application file for complete search history.

(56) References Cited

U.S. PATENT DOCUMENTS

| 8,946,845 B1* | 2/2015 | Hynecek | H01L 27/1461 250/208.1 |
|---|---|---|---|
| 2013/0130429 A1* | 5/2013 | Hynecek | H01L 27/1463 438/70 |
| 2015/0054997 A1* | 2/2015 | Hynecek | H01L 27/14643 348/302 |
| 2015/0188049 A1* | 7/2015 | Ghenciu | B82Y 10/00 257/2 |

FOREIGN PATENT DOCUMENTS

JP 2008-098601 A 4/2008

* cited by examiner

*Primary Examiner* — Anthony Ho
(74) *Attorney, Agent, or Firm* — Oliff PLC

(57) ABSTRACT

An imaging device is provided, the imaging device including: a first-conductivity-type substrate; a first-conductivity-type element forming portion provided on the substrate, and having a concentration lower than the substrate; and a plurality of pixel portions provided in the element forming portion, and arrayed two-dimensionally, each pixel portion having a light receiving element, and a second-conductivity-type carrier absorbing portion provided in an area different from an area where the light receiving element is provided. At least one pixel portion of the pixel portions has: a first-conductivity-type first wall portion provided on a substrate side relative to the light receiving element, the first wall portion overlapping at least part of the light receiving element in an array direction of the pixel portions, and having a concentration higher than the substrate, and a carrier passage area not provided with the first wall portion in the array direction of the pixel portions.

18 Claims, 12 Drawing Sheets

IMAGING DEVICE AND MANUFACTURING METHOD THEREOF

The contents of the following patent applications are incorporated herein by reference:
2017-014915 filed in JP on Jan. 30, 2017; and
PCT/JP2017/046792 filed on Dec. 26, 2017

BACKGROUND

1. Technical Field

The present invention relates to an imaging device and an imaging device manufacturing method.

2. Related Art

There are conventional, known imaging devices having photodiodes (see Patent Literature 1, for example).
Patent Literature 1: Japanese Patent Application Publication No. 2008-098601

However, in conventional imaging devices, dark current components generated in substrates are accumulated in photodiodes in some cases.

[General Disclosure]

A first aspect of the present invention provides an imaging device including: a first-conductivity-type substrate; a first-conductivity-type element forming portion that provided on the substrate, and has a concentration lower than the substrate; and a of pixel portions that are provided in the element forming portion, and are arrayed two-dimensionally, each pixel portion having a light receiving element, and a second-conductivity-type carrier absorbing portion provided in an area different from an area where the light receiving element is provided, wherein at least one pixel portion of the plurality of pixel portions has: a first-conductivity-type first wall portion provided on the substrate side relative to the light receiving element, the first wall portion overlapping at least part of the light receiving element in an array direction of the plurality of pixel portions, and having a concentration higher than the substrate, and a carrier passage area not provided with the first wall portion in the array direction of the plurality of pixel portions.

A second aspect of the present invention provides an imaging device manufacturing method including: preparing a first-conductivity-type substrate; forming a first-conductivity-type element forming portion on the substrate, the element forming portion having a concentration lower than the substrate; forming a first-conductivity-type first wall portion and a carrier passage area in the substrate or the element forming portion, the first wall portion having a concentration higher than the substrate, the carrier passage area being not provided with the first wall portion; and forming a light receiving element and a second-conductivity-type carrier absorbing portion in the element forming portion such that a plurality of pixel portions are two-dimensionally arrayed, the carrier absorbing portion being provided in an area different from an area where the light receiving element is provided, each pixel portion having the light receiving element and the carrier absorbing portion, wherein at least one pixel portion of the plurality of pixel portions includes the light receiving element formed to overlap at least part of the first wall portion in the array direction of the plurality of pixel portions.

The summary clause does not necessarily describe all necessary features of the embodiments of the present invention. The present invention may also be a sub-combination of the features described above.

BRIEF DESCRIPTION OF THE DRAWINGS

FIG. 7A illustrates an exemplary step of forming first wall portions 41a.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

First Embodiment

Figure 1A:
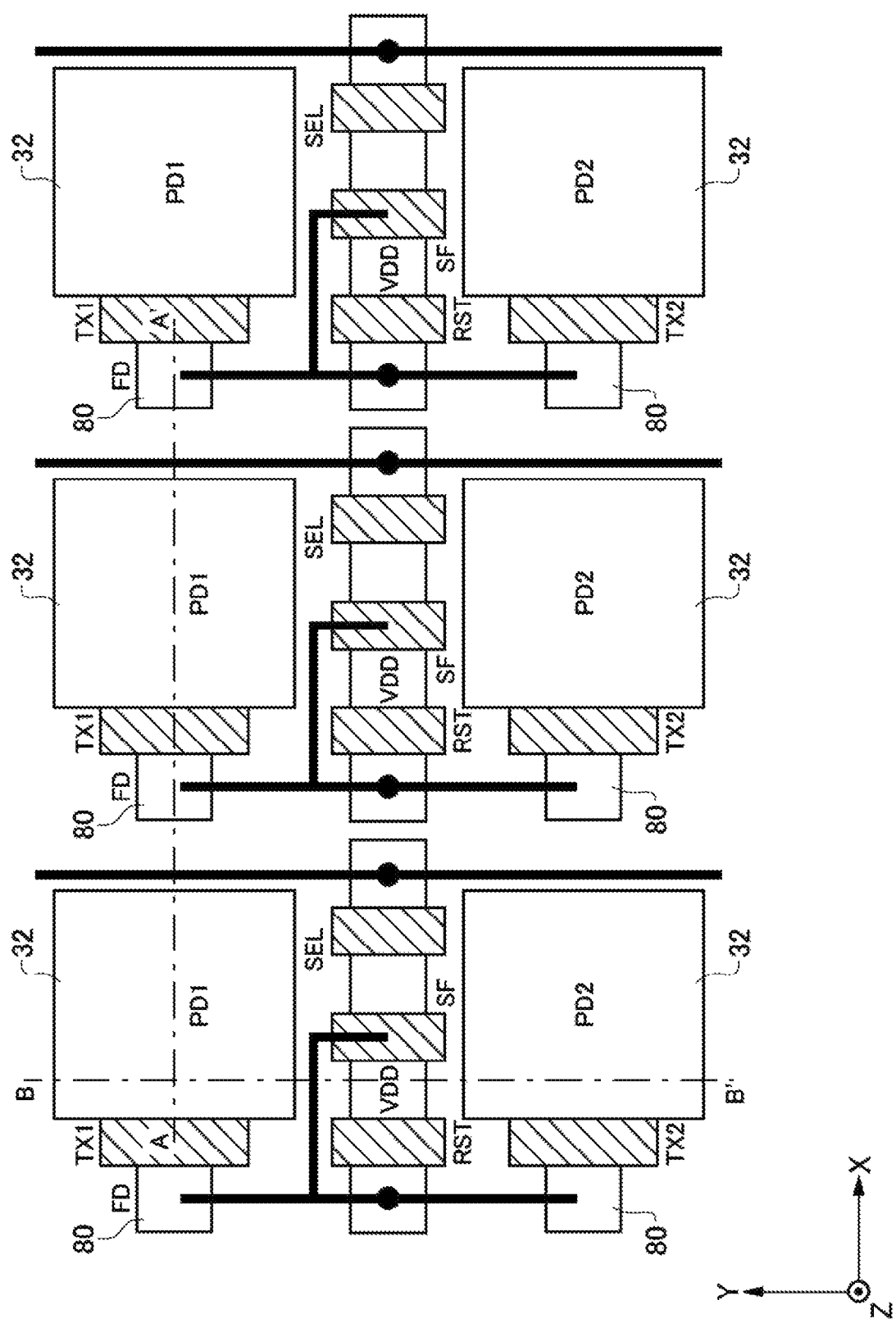
FIG. 1A illustrates an exemplary top view of an imaging device 100 according to a first embodiment.
Figure 1B:
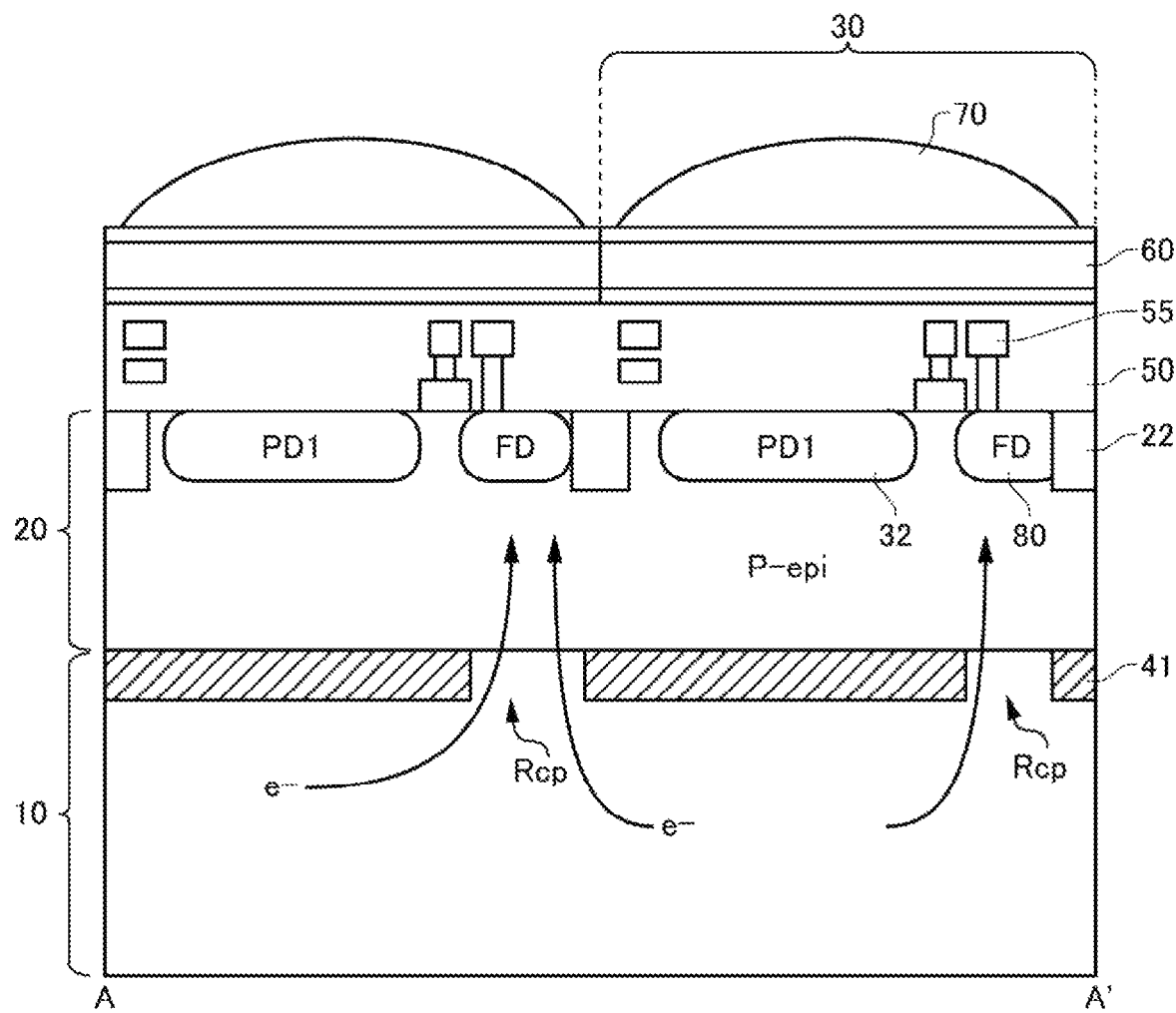
FIG. 1B illustrates an exemplary cross-sectional view taken along A-A' in the imaging device 100 according to the first embodiment.
Figure 1C:
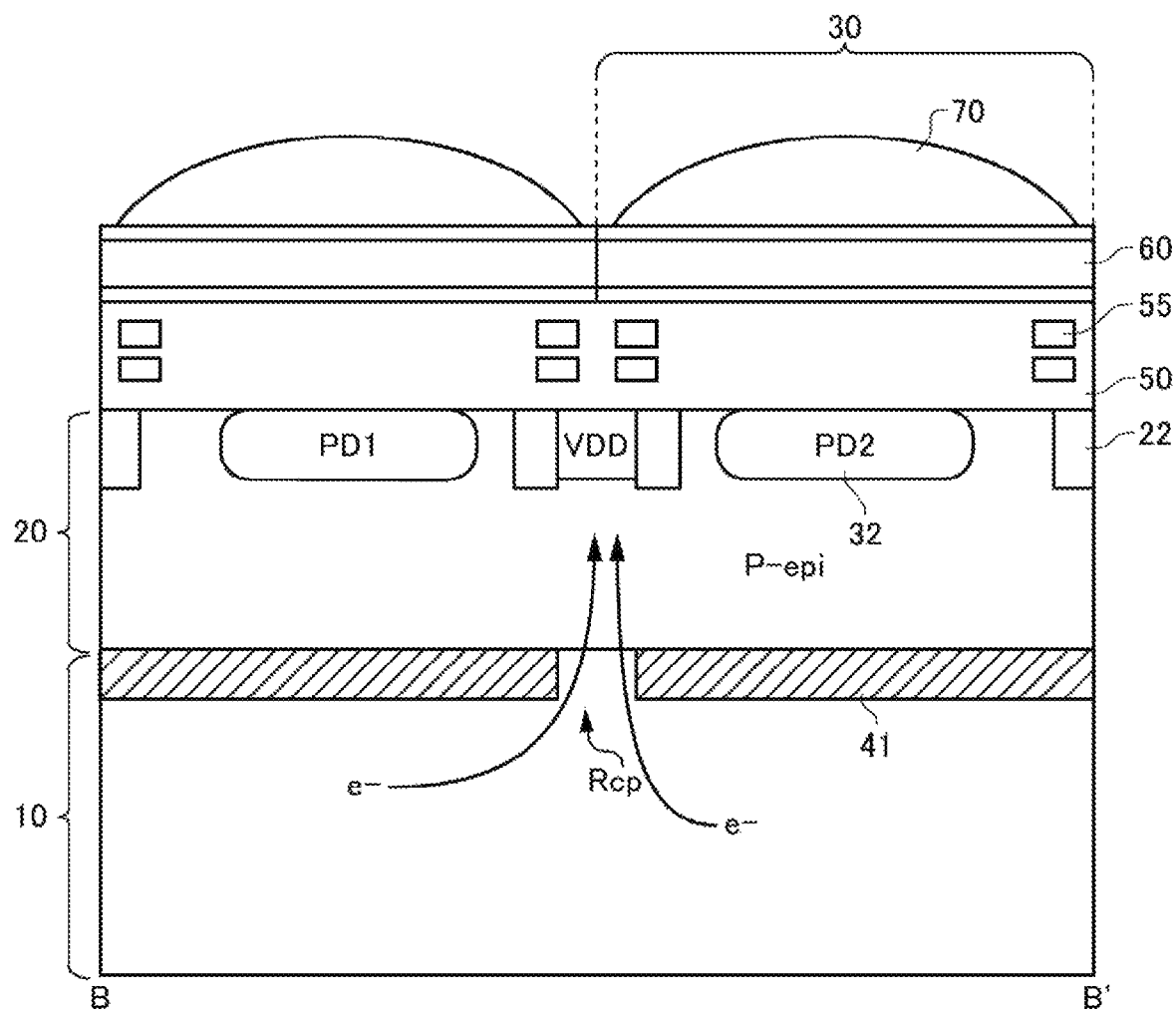
FIG. 1C illustrates an exemplary cross-sectional view taken along B-B' in the imaging device 100 according to the first embodiment.

FIG. 1A illustrates an exemplary top view of an imaging device 100 according to a first embodiment. FIG. 1B illustrates an exemplary cross-sectional view taken along A-A' in the imaging device 100 according to the first embodiment. FIG. 1C illustrates an exemplary cross-sectional view taken along B-B' in the imaging device 100 according to the first embodiment. The imaging device 100 of the present example includes a substrate 10, an element forming portion 20, pixel portions 30, a wiring layer 50, a color filter 60 and lens portions 70. The wiring layer 50 has wiring portions 55.

The substrate 10 is of a first conductivity type. The substrate 10 of the present example is a P type semiconductor substrate. The conductivity type of the substrate 10 may be selected depending on the wavelength band of light that the imaging device 100 receives or the like. For example, if the imaging device 100 receives light in the infrared wavelength band, a P type substrate 10 is used. If the substrate 10 includes defects, carriers are generated from the substrate 10 in some cases. Electrons are generated as carriers in the substrate 10 of the present example. Carriers generated in the substrate 10 become dark current components of the imaging device 100. Note that, in explanations in the present specification, the first conductivity type is P type, and a second conductivity type is N type. It should be noted however that similar principles apply even if the first conductivity type is N type, and the second conductivity type is P type.

The element forming portion 20 is provided above the substrate 10. The element forming portion 20 is a P type semiconductor layer having a concentration lower than the substrate 10. The element forming portion 20 of the present example is an epitaxial layer or well layer formed on the substrate 10. Note that, in the present specification, the Z-axis positive direction is defined as the upward direction, and the Z-axis negative direction is defined as the downward direction. The plane on which the substrate 10 lies is defined as the X-Y plane perpendicular to the Z axis.

Each pixel portion 30 receives light entering the imaging device 100. The imaging device 100 of the present example includes a plurality of pixel portions 30 arrayed two-dimensionally. Each of the plurality of pixel portions 30 has a light receiving element 32 and a carrier absorbing portion 80. The plurality of pixel portions 30 are arrayed in directions parallel to the X axis and Y axis on the X-Y plane. In the present specification, the directions parallel to the X axis and Y axis are referred to as array directions of the pixel portions 30. At least one pixel portion 30 of the plurality of pixel portions 30 has a first wall portion 41.

Light receiving elements 32 are photodiodes that are arrayed two-dimensionally. The light receiving elements 32 of the present example have photodiodes PD1 and photodiodes PD2. The photodiodes PD1, and the photodiodes PD2 are arrayed in the X-axis direction. A photodiode PD1 and a photodiode PD2 are adjacent to each other in the Y-axis direction.

Each first wall portion 41 suppresses accumulation, in a light receiving element 32, of carriers generated in the substrate 10. In one example, the first wall portion 41 is a P type semiconductor layer having a concentration higher than the substrate 10. The first wall portion 41 is provided on the substrate 10 side relative to the light receiving elements 32. In addition, the first wall portion 41 is provided to overlap at least part of a light receiving element 32 in the array directions of the plurality of pixel portions 30. That is, the first wall portion 41 has a planar shape approximately parallel to the X-Y plane, and overlaps at least part of a light receiving element 32 in the plan view illustrated in FIG. 1A. The first wall portion 41 of the present example is provided in the substrate 10. The first wall portion 41 is provided in the substrate 10 at its boundary with the element forming portion 20. The first wall portion 41 may be formed to include the boundary between the substrate 10 and the element forming portion 20. In addition, the first wall portion 41 may be formed on the substrate 10 side in the element forming portion 20. It is optimal for the first wall portion 41 to be provided at the boundary between them in terms of restricting movement of carriers generated in the substrate 10 toward the light receiving elements 32. Note that the first wall portion 41 may be formed inside the element forming portion 20.

A carrier passage area Rcp refers to an area where carriers generated in the substrate 10 pass. That is, the carrier passage area Rcp is a portion in the array directions of the plurality of pixel portions 30 where the first wall portion 41 is not provided. The carrier passage area Rcp overlaps at least part of a carrier absorbing portion 80 in the array directions of the plurality of pixel portions 30.

Carrier absorbing portions 80 absorb carriers generated in the substrate 10. The carrier absorbing portions 80 are provided in areas different from the areas where the light receiving elements 32 are provided, in the plan view. In the present specification, the plan view refers to a view as seen in the Z-axis direction. The carrier absorbing portions 80 of the present example are N type impurity layers that absorb electrons generated in the substrate 10. For example, the carrier absorbing portions 80 are floating diffusion layers (floating diffusions: FD) formed in the pixel portions 30. It should be noted however that the carrier absorbing portions 80 are not limited to them as long as they can absorb carriers generated in the substrate 10.

For example, the carrier absorbing portions 80 include at least one of a floating diffusion (FD), the source or drain of a selection transistor (SEL), the source or drain of a reset transistor (RST), the source or drain of an amplification transistor (SF), the source or drain of a switch (TX1, TX2) interconnecting a plurality of floating diffusions, and a diffusion area of a power supply (VDD). Thereby, carriers generated in the substrate 10 pass through carrier passage areas Rcp between first wall portions 41, and are absorbed by the carrier absorbing portions 80.

In one example, the carrier absorbing portions 80 are set at a predetermined potential. The carrier absorbing portions 80 are preferably provided in electrically not floating areas. If the carrier absorbing portions 80 are diffusion areas of a power supply, the carrier absorbing portions 80 are fixed at the power supply voltage. For example, the carrier absorbing portions 80 are fixed at 5 V as the power supply voltage.

Element isolating portions 22 cut off electrical connections between adjacent pixel portions 30. Thereby, the element isolating portions 22 isolate adjacent pixel portions 30. The element isolating portions 22 are provided on the upper end side in the element forming portion 20. In addition, the element isolating portions 22 are adjacent to carrier absorbing portions 80 in the plan view. In one example, the element isolating portions 22 are formed by STI (shallow trench isolation) in which trenches are formed in the element forming portion 20, and oxide films are embedded in the trenches.

The pixel portions 30 of the present example each include a first wall portion 41 and a carrier passage area Rcp. In addition, each pixel portion 30 has a carrier absorbing portion 80. Thereby, a pixel portion 30 causes carriers generated in the substrate 10 to be absorbed by the carrier absorbing portion 80 of the pixel portion 30. Dark current components are not accumulated in a light receiving element 32 of each pixel portion 30. Therefore, noise resulting from dark current decreases, and the quality of an image captured by the imaging device 100 improves.

Note that the pixel portions 30 may each share part of their configurations with adjacent pixel portions 30. For example, a power supply, a selection transistor, an amplification transistor, and a reset transistor may be shared among a plurality of adjacent pixel portions 30. In the present example, two pixel portions 30 that are adjacent to each other in the Y-axis direction share a power supply, a selection transistor, an amplification transistor, and a reset transistor. That is, two photodiodes, a photodiode PD1 and a photodiode PD2, are provided with one power supply, one selection transistor, one amplification transistor, and one reset transistor.

The imaging device 100 of the present example guides carriers generated in the substrate 10 to carrier absorbing portions 80 by using first wall portions 41. Thereby, the imaging device 100 suppresses accumulation, in light receiving elements 32, of dark current components from the substrate 10. The imaging device 100 of the present example not only suppresses carriers generated in the substrate 10 at potential barriers formed by the first wall portions 41, but also guides the carriers through the carrier passage areas Rcp to the carrier absorbing portions 80. That is, the first wall portions 41 also serve as guiding members whose function is to guide carriers to the carrier passage areas Rcp. Thus, as compared with the case where carriers are suppressed simply at the potential barriers, the effect of suppressing dark currents is higher.

[First Comparative Example]

Figure 2:
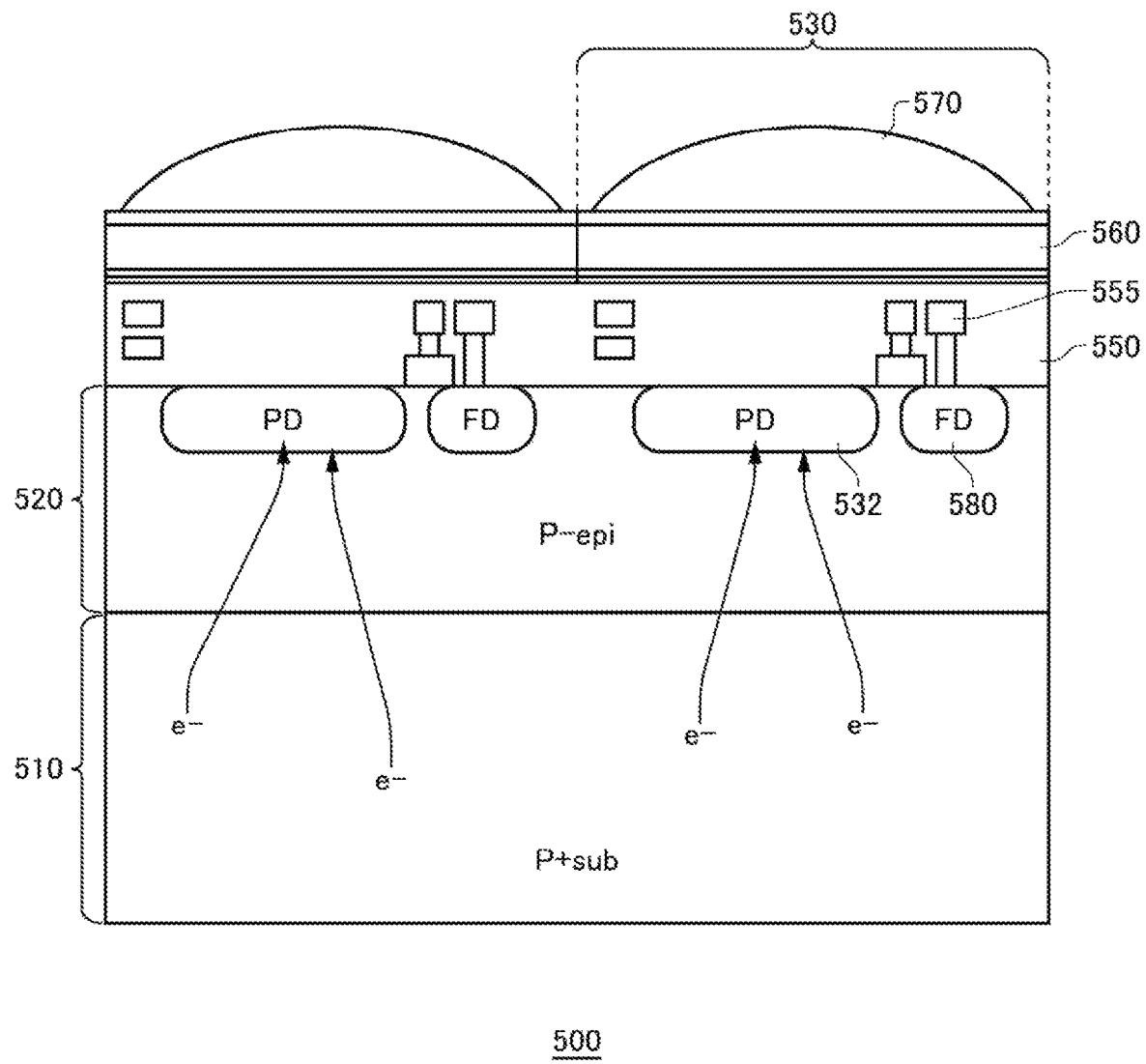
FIG. 2 illustrates a cross-sectional view of an imaging device 500 according to a first comparative example.

FIG. 2 illustrates a cross-sectional view of an imaging device 500 according to a first comparative example. The imaging device 500 of the present example includes a substrate 510, an element forming portion 520, pixel portions 530, a wiring layer 550, color filters 560, and lens portions 570. The element forming portion 520 has light receiving elements 532, and floating diffusion layers 580 formed therein. The wiring layer 550 has wiring portions 555.

The imaging device 500 has a P+ type substrate 510, and a P− type element forming portion 520. The substrate 510 includes defects in some cases. For example, if the substrate 510 includes defects, carriers are generated from the defects, and dark current is generated in some cases. If dark current is generated in the substrate 510, it flows into the light receiving elements 532, and the characteristics of the imaging device 500 deteriorate.

[Second Comparative Example]

Figure 3:
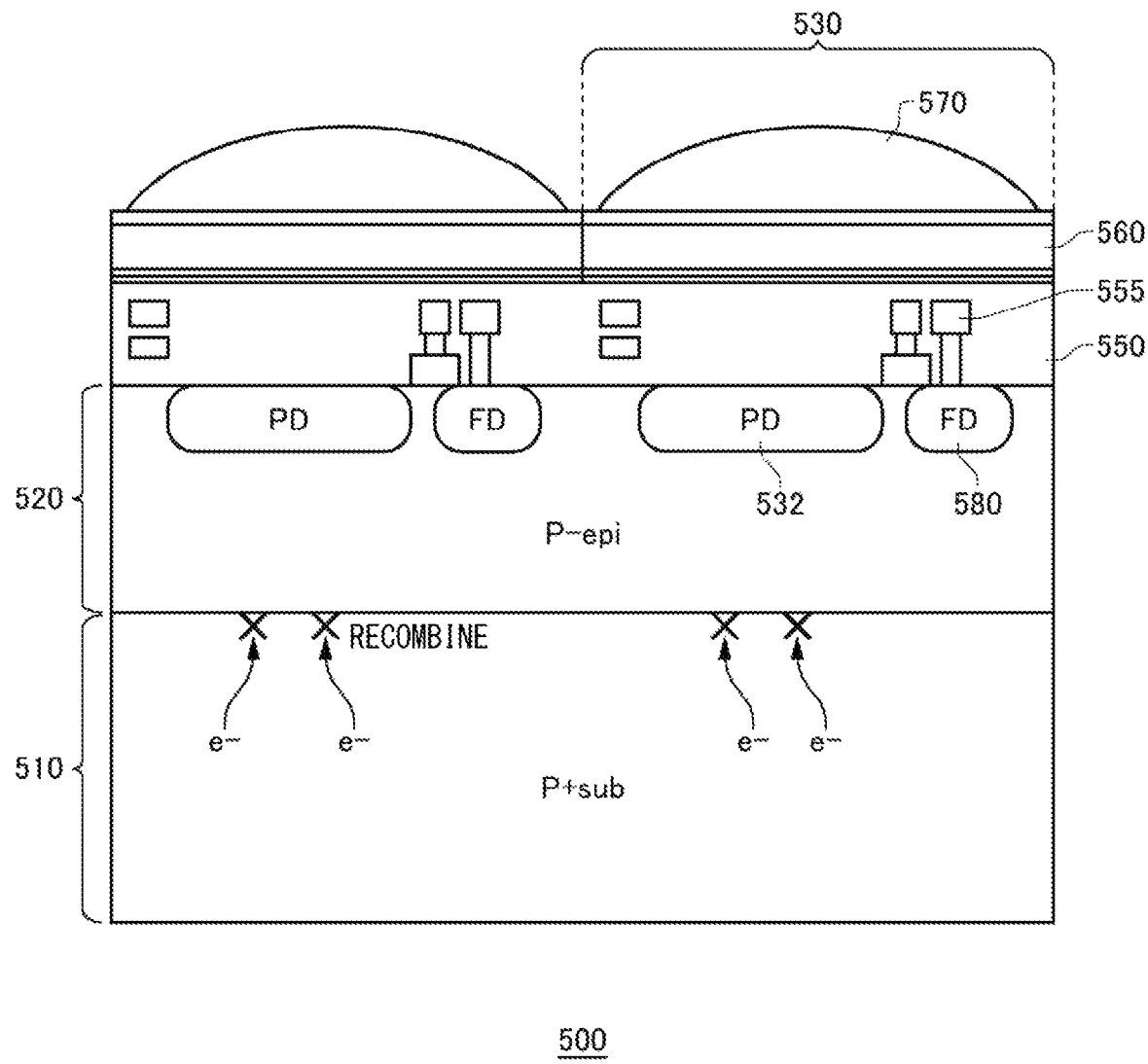
FIG. 3 illustrates a cross-sectional view of the imaging device 500 according to a second comparative example.

FIG. 3 illustrates a cross-sectional view of the imaging device 500 according to a second comparative example. The imaging device 500 of the present example is different from the imaging device 500 according to the first comparative example in that the substrate 510 has a higher concentration.

The imaging device 500 having the substrate 510 at a higher P type impurity concentration causes electrons generated in the substrate 510 to recombine. Thereby, generation of dark current is suppressed. However, if the high concentration substrate 510 is used, it becomes difficult to adjust the concentration of the element forming portion 520 formed on the substrate 510. For example, if the element forming portion 520 is to be formed on the substrate 510 by epitaxial growth, overdoping occurs in which impurities of the substrate 510 are diffused in the element forming portion 520.

[Third Comparative Example]

Figure 4:
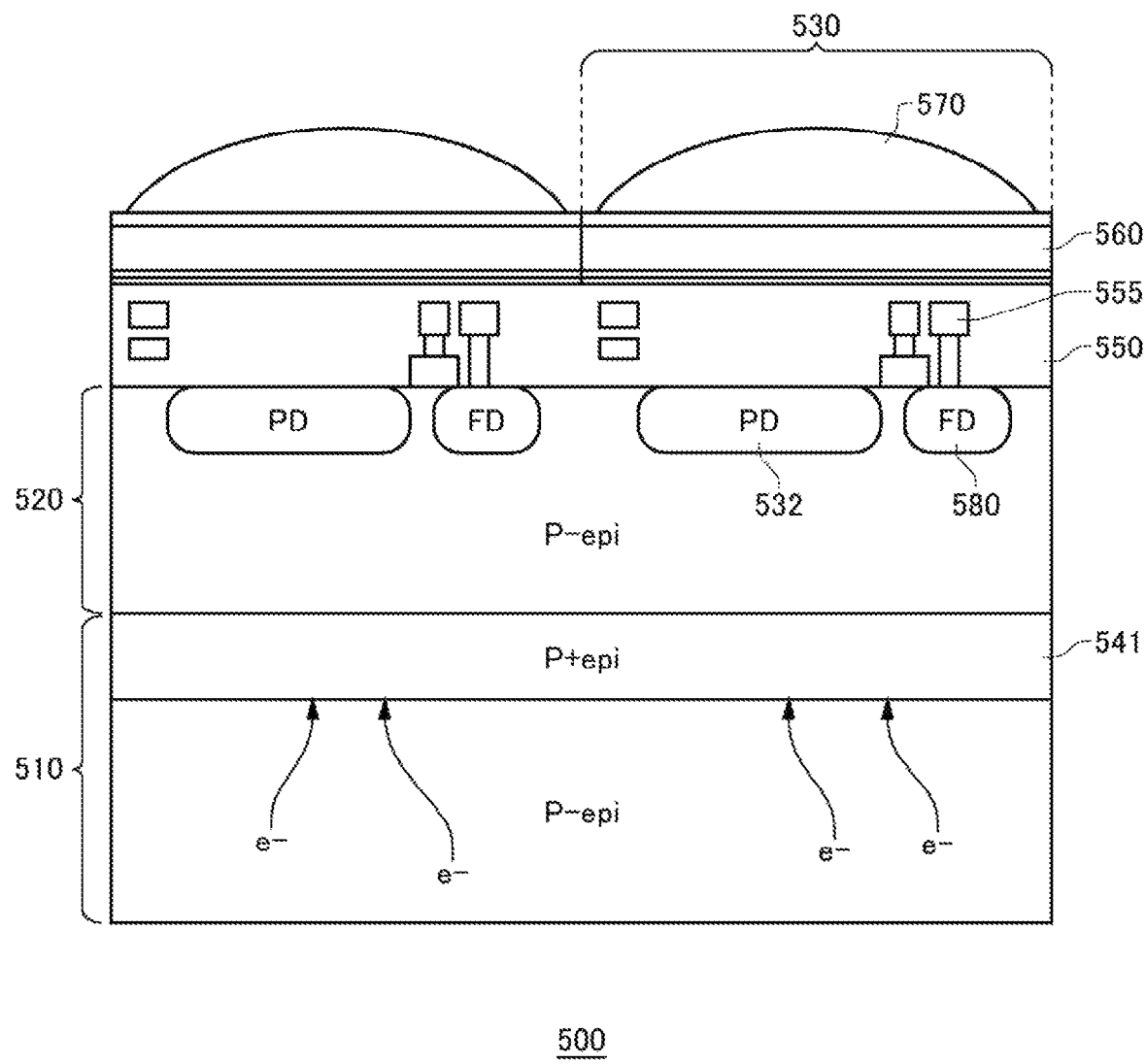
FIG. 4 illustrates a cross-sectional view of the imaging device 500 according to a third comparative example.

FIG. 4 illustrates a cross-sectional view of the imaging device 500 according to a third comparative example. The imaging device 500 of the present example is different from the imaging device 500 according to the first comparative example in that it has a wall portion 541.

The wall portion 541 is a P type impurity layer provided over the entire surface of the substrate 10. The wall portion 541 suppresses passage of electrons generated in the substrate 510 to the element forming portion 520. However, the imaging device 500 of the present example does not have an escape route for the electrons generated in the substrate 510 to pass through. Thus, some of the electrons generated in the substrate 510 pass through the wall portion 541 and enter the element forming portion 520 in some cases. Therefore, although the imaging device 500 of the present example provides the effect of reducing dark current, it cannot suppress dark current completely.

Note that there is a method of providing a cooling apparatus as a possible method of suppressing dark current in the imaging device 500. Generation of electrons in the substrate 510 is suppressed by cooling the imaging device 500. However, the method of providing a cooling apparatus incurs significant disadvantages such as size increase or cost increase of an apparatus since the cooling apparatus is provided. Furthermore, since a method that involves cooling reduces thermal diffusion of electrons, the characteristics of charge transfer from a photodiode to a floating diffusion layer deteriorate.

Second Embodiment

Figure 5:
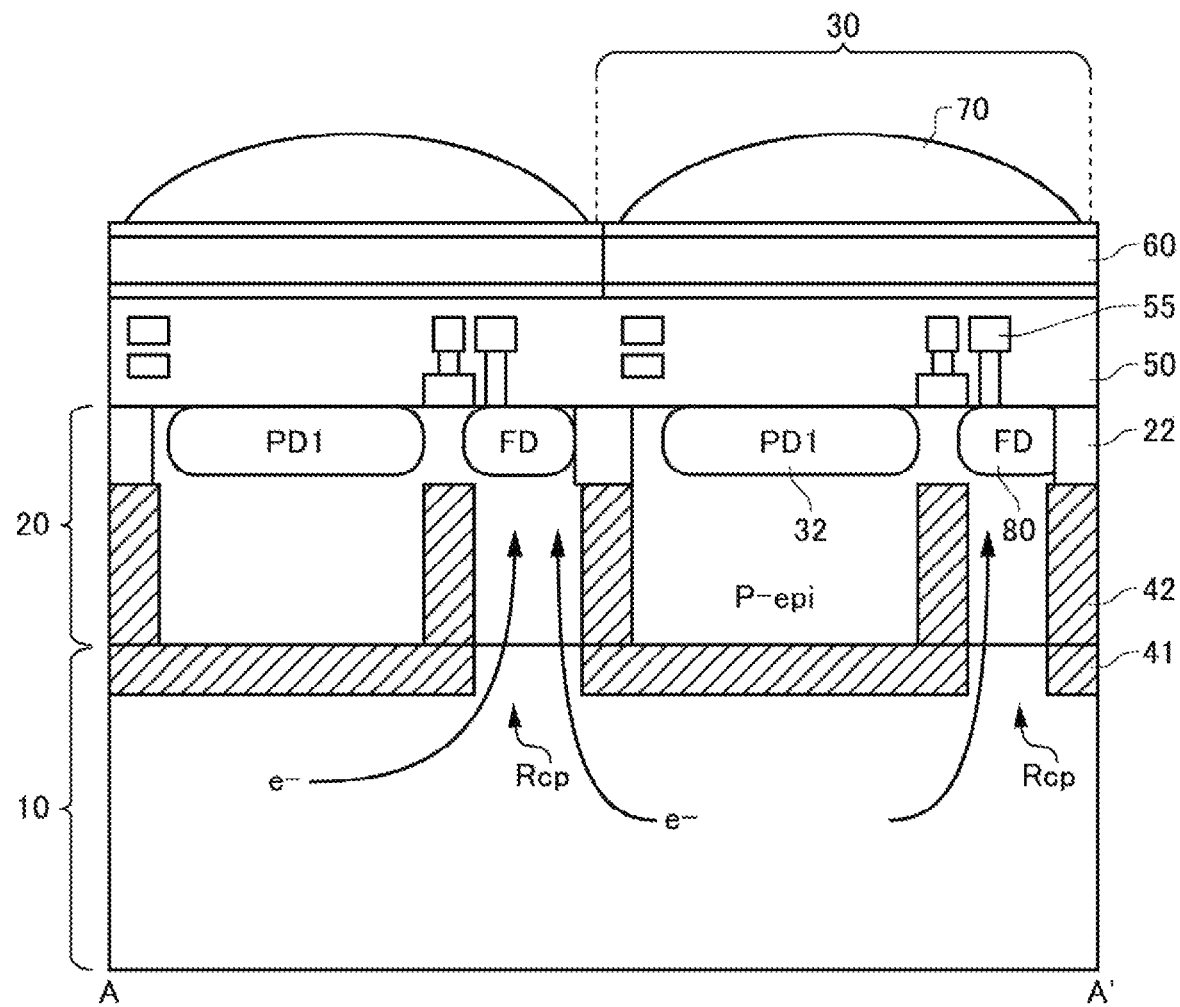
FIG. 5 illustrates an exemplary configuration of the imaging device 100 according to a second embodiment.
Figure 5:
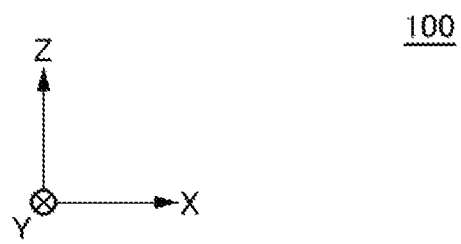

FIG. 5 illustrates an exemplary configuration of the imaging device 100 according to a second embodiment. The imaging device 100 of the present example is different from the imaging device 100 according to the first embodiment in that it includes second wall portions 42. In the present example, differences from the first embodiment are explained mainly.

The second wall portions 42 suppress accumulation, in the light receiving elements 32, of carriers having passed through the carrier passage areas Rcp. That is, the second wall portions 42 are provided to guide the carriers having passed through the carrier passage areas Rcp to the carrier absorbing portions 80. The second wall portions 42 extend inclined to the array directions of the plurality of pixel portions 30, and are provided in the element forming portion 20. The second wall portions 42 of the present example have tabular shapes, and have their surface directions along the Z-axis direction. The second wall portions 42 are P type semiconductor layers having a concentration higher than the element forming portion 20. The second wall portions 42 are preferably formed in contact with the first wall portions 41.

In one example, the second wall portions 42 are provided in contact with the element isolating portions 22. In this case, the positions of the upper ends of the second wall portions 42 may be positioned on the upper end side in the element forming portion 20 relative to the positions of the lower ends of the carrier absorbing portions 80. The second wall portions 42 of the present example are provided below the element isolating portions 22. Thereby, the second wall portions 42 prevent carriers generated in the substrate 10 from not being absorbed by the carrier absorbing portions 80 and so from being accumulated in the light receiving elements 32. The positions at which the second wall portions 42 are provided are not limited to these positions as long as they can guide the carriers generated in the substrate 10 to the carrier absorbing portions 80. For example, the second wall portions 42 may have inclined surface directions as long as they extend inclined to the array directions of the plurality of pixel portions 30. Specifically, the second wall portions 42 may be inclined such that the second wall portions 42 become closer to the carrier absorbing portions 80 in the plan view at higher portions thereof. By providing the second wall portions 42 such that the areas from the carrier passage areas Rcp to the carrier absorbing portions 80 dwindle gradually, it becomes easier for carriers generated in the substrate 10 to be guided to the carrier absorbing portions 80. Note that the second wall portions 42 are not necessarily required to be tabular, but may have stepwise shapes or curved shapes, for example.

The impurity concentration of the second wall portions 42 is the same as the impurity concentration of the first wall portions 41, in one example. It should be noted however that the impurity concentration of the second wall portions 42 may be different from the impurity concentration of the second wall portions 42. In one example, the impurity concentration of the first wall portions 41 is higher than the impurity concentration of the second wall portions 42. The impurity concentrations of the first wall portions 41 and second wall portions 42 may result from ion implantation at the same dopant concentration. If the first wall portions 41 are formed in the high concentration substrate 10, and the second wall portions 42 are formed in the element forming portion 20 having a concentration lower than the substrate 10, the impurity concentration of the first wall portions 41 becomes higher than the impurity concentration of the second wall portions 42 even if ions are implanted at the same dopant concentration.

Third Embodiment

Figure 6:
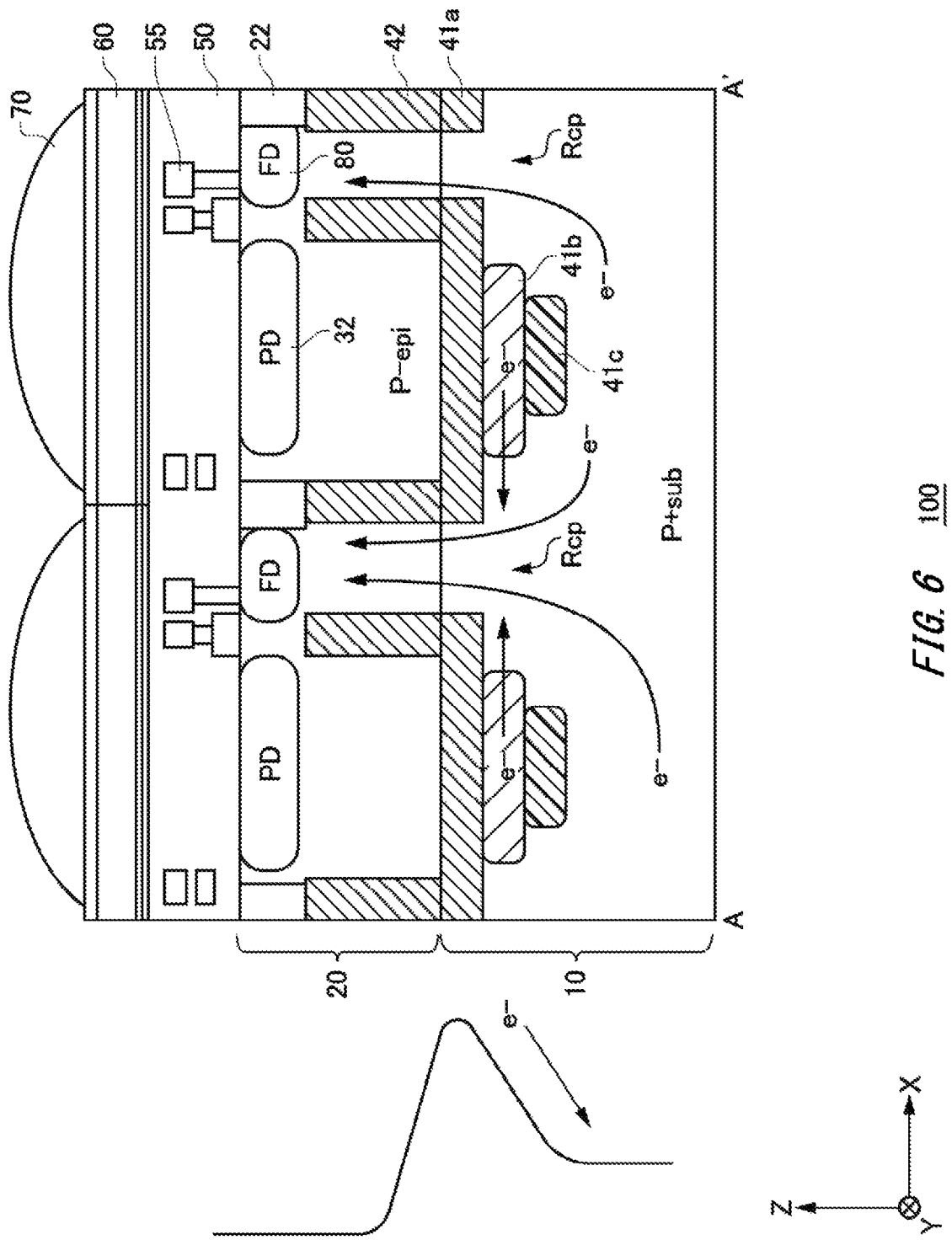
FIG. 6 illustrates an exemplary configuration of the imaging device 100 according to a third embodiment.

FIG. 6 illustrates an exemplary configuration of the imaging device 100 according to a third embodiment. The imaging device 100 of the present example has a plurality of stacked first wall portions 41a, 41b, 41c.

Similar to the first wall portions 41 according to the first and second embodiments, each first wall portion 41a is formed at the upper surface of the substrate 10. The first wall portion 41a of the present example is provided to cover the entire surface of a light receiving element 32 in the plan view.

Each first wall portion 41b is provided below a first wall portion 41a. The first wall portion 41b is provided in an area of a light receiving element 32 corresponding to its center side in the plan view. In addition, the first wall portion 41b is provided in an area smaller than the first wall portion 41a in the plan view. The impurity concentration of the first wall portions 41b is the same as the impurity concentration of the first wall portions 41a. It should be noted however that the impurity concentration of the first wall portion 41b may be different from the impurity concentration of the first wall portion 41a.

Each first wall portion 41c is provided below a first wall portion 41a. The first wall portion 41c is provided below a first wall portion 41b. The first wall portion 41c is provided in an area of a light receiving element 32 corresponding to its center side in the plan view. In addition, the first wall portion 41c is provided in an area smaller than the first wall portion 41a and first wall portion 41b in the plan view. That is, the plurality of first wall portions 41a, 41b, 41c are provided to have areas that decrease in width in the order from the one closer to the light receiving element 32 to the one closer to the substrate 10. The impurity concentration of the first wall portions 41c is the same as the impurity concentrations of the first wall portions 41a and first wall portion 41b. It should be noted however that the impurity concentration of the first wall portion 41c may be different from the impurity concentrations of the first wall portion 41a and first wall portion 41b.

The electron potential distribution in the Z-axis direction becomes high near the first wall portions 41a. The first wall portions 41 of the present example include the first wall portions 41a, the first wall portions 41b and the first wall portions 41c that are formed in this order from the Z-axis positive side. The areas where the first wall portions 41a are formed are larger than the areas where the first wall portions 41b are formed. In addition, the areas where the first wall portions 41b are formed are larger than the areas where the first wall portions 41c are formed. Thus, the electron potential distribution in the Z-axis direction is inclined such that the potential is high at the depth position of the first wall portions 41a, and is low at the depth positions of the first wall portions 41b and first wall portions 41c. Therefore, it becomes easier for electrons formed in the substrate 10 to be guided downward from the first wall portion 41a side. Accordingly, the effect of suppressing accumulation of electrons in the light receiving element 32 as a result of the electrons moving past the first wall portions 41a becomes higher.

On the other hand, their areas in the X-axis direction increase in the order from the one located lower to the one located higher, that is, in the order of the first wall portions 41c, 41b, and 41. Thereby, the areas with high potential in the X-axis direction increase in the order from the one located lower to the one located higher, that is, in the order of the first wall portions 41c, 41b, and 41a. Therefore, it becomes easier for electrons formed in the substrate 10 to be guided to the carrier passage areas Rcp as they advance from lower regions to higher regions.

FIG. 7A to FIG. 7D illustrate an exemplary method of manufacturing the imaging device 100. The manufacturing method of the present example is merely one example, and the imaging device 100 may be manufactured by a different method.

Figure 7A:
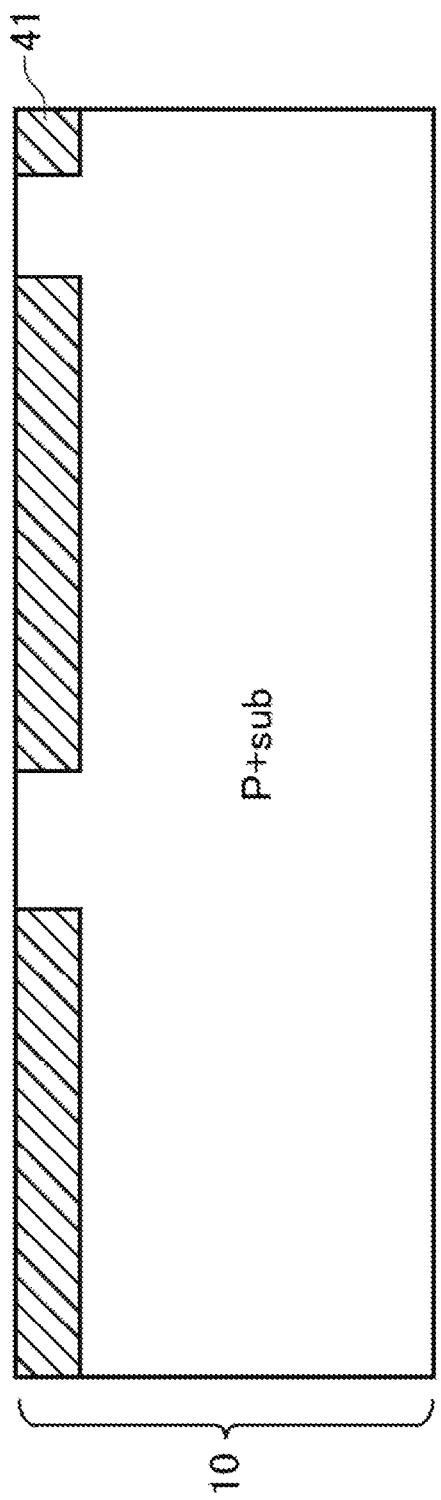

FIG. 7A illustrates an exemplary step of forming the first wall portions 41. First, the P type substrate 10 is prepared. The first wall portions 41 are formed by ion implantation onto the front surface of the substrate 10. The first wall portions 41 of the present example are formed to have an impurity concentration higher than the impurity concentration of the substrate 10 by performing ion implantation of a P type dopant. In this manner, the step of forming the first wall portions 41 of the present example is executed before a step of forming the element forming portion 20 above the substrate 10. Thereby, the first wall portions 41 are formed at the upper surface of the substrate 10. In addition, by performing ion implantation before formation of the element forming portion 20, the first wall portions 41 can be formed with a small acceleration energy.

Figure 7B:
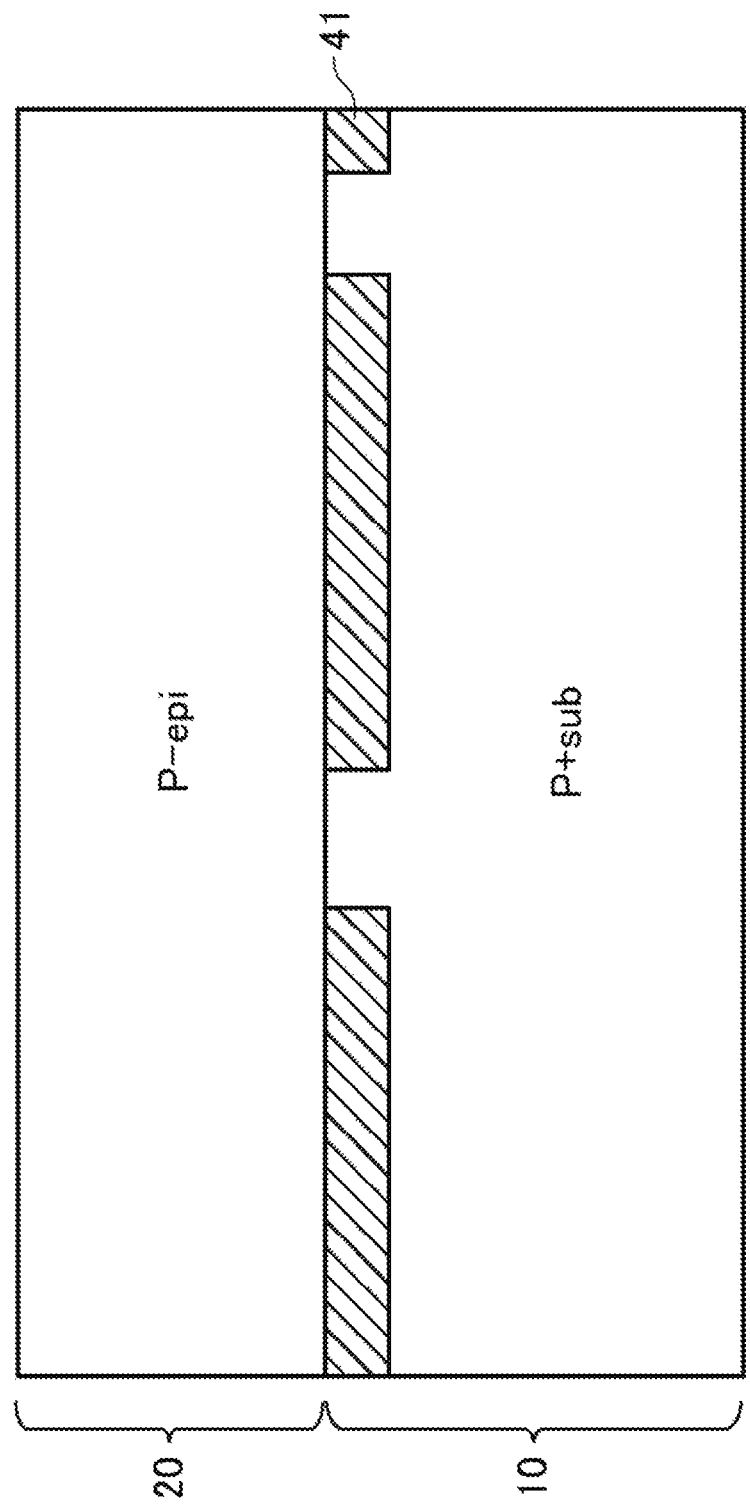
FIG. 7B illustrates an exemplary step of forming an element forming portion 20.

FIG. 7B illustrates an exemplary step of forming the element forming portion 20. The P type element forming portion 20 having a concentration lower than the substrate 10 is formed above the substrate 10. The element forming portion of the present example 20 is formed by epitaxial growth on the substrate 10. In addition, after the formation of the element forming portion 20, a well layer for forming a peripheral circuit may be formed. Note that if the first wall portions 41 are formed not in the substrate 10 but in the element forming portion 20, the element forming portion 20 may be formed without performing the formation of the first wall portions 41 illustrated in FIG. 7A, and then the first wall portions 41 may be formed by performing ion implantation of a P type dopant in the element forming portion 20. In addition, the first wall portions 41 may be formed, and then the element forming portion 20 may be further formed above the first wall portions 41.

Figure 7C:
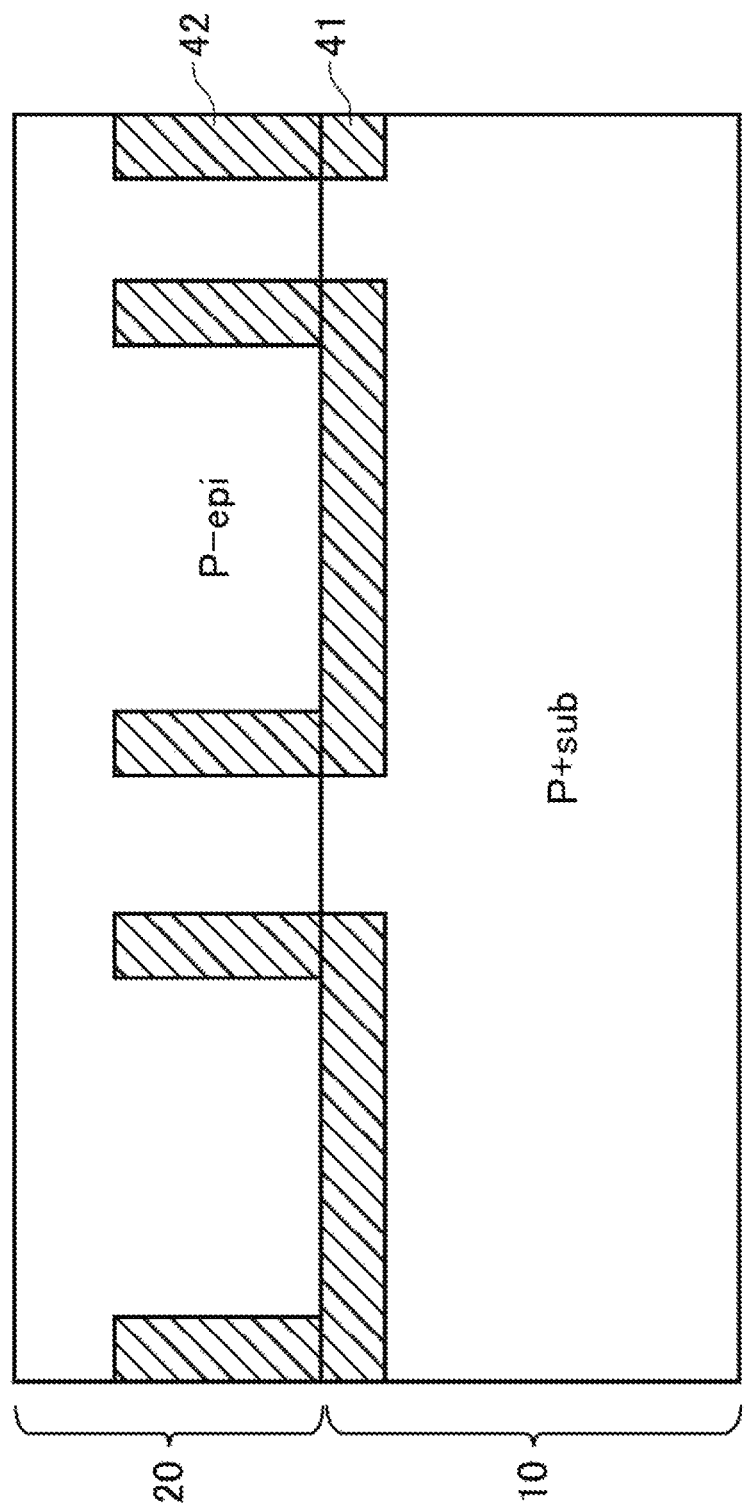
FIG. 7C illustrates an exemplary step of forming second wall portions 42.

FIG. 7C illustrates an exemplary step of forming the second wall portions 42. A step of forming the second wall portions 42 in the element forming portion 20 may further be provided after the step of forming the element forming portion 20 above the substrate 10. For example, the second wall portions 42 of the present example are formed at once after completely forming the element forming portion 20. The second wall portions 42 of the present example are formed by performing ion implantation of a P type dopant from above the element forming portion 20.

In addition, a step of forming the second wall portions 42 in the element forming portion 20 may be provided before the step of completely forming the element forming portion 20 above the substrate 10. In this case, the formation of the element forming portion 20 and the formation of the second wall portions 42 may be performed at multiple separate steps. For example, the second wall portions 42 are formed by repeating, multiple times, the step of forming the element forming portion 20 above the substrate 10, and the step of forming the second wall portions 42 in the element forming portion 20. Here, in some cases, the acceleration energy of the ion implantation for the second wall portions 42 is limited, and the ion implantation for the element forming portion 20 cannot be performed at once. Even in such a case, the formation of the second wall portions 42 is realized by performing the ion implantation into the element forming portion 20 at separate multiple steps.

Figure 7D:
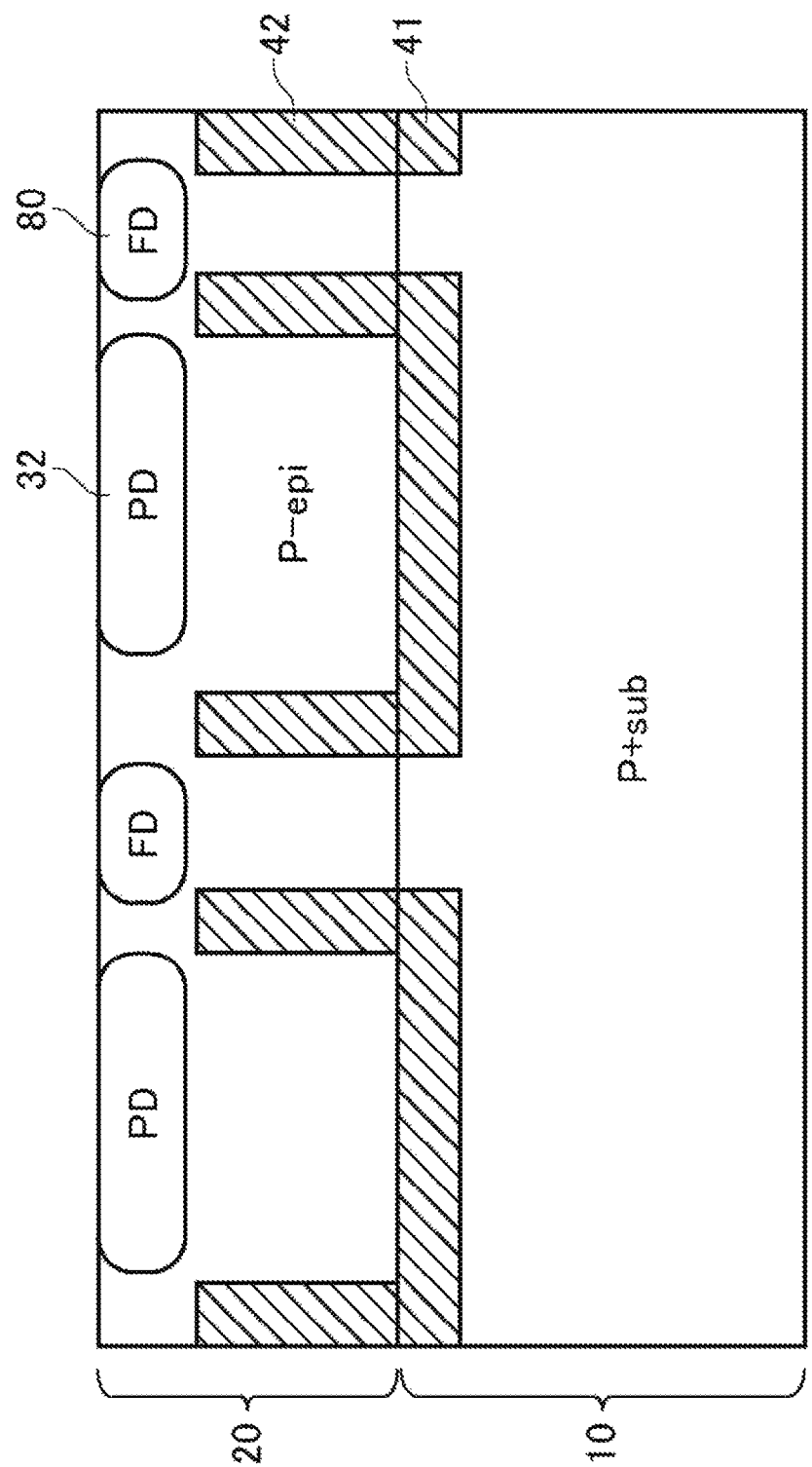
FIG. 7D illustrates an exemplary step of forming light receiving elements 32 and carrier absorbing portions 80.

FIG. 7D illustrates an exemplary step of forming the light receiving elements 32 and carrier absorbing portions 80. The light receiving elements 32 and carrier absorbing portions 80 may be formed in the element forming portion 20 by typical semiconductor processes.

The light receiving elements 32 are formed corresponding to the first wall portions 41. In one example, the light receiving elements 32 are formed to at least partially overlap the first wall portions 41 in the plan view. In addition, the entire areas of the light receiving elements 32 may be formed to overlap the first wall portions 41 in the plan view. The light receiving elements 32 are formed on the front surface side in the element forming portion 20. The first wall portions 41 of the present example are formed on the substrate 10 side relative to the light receiving elements 32 such that the first wall portions 41 overlap at least parts of the light receiving elements 32 in the array directions of the plurality of pixel portions 30.

The carrier absorbing portions 80 are formed corresponding to the carrier passage areas Rcp. In one example, the carrier absorbing portions 80 are formed to at least partially overlap the carrier passage areas Rcp in the plan view. In addition, the entire areas of the carrier absorbing portions 80 may be formed to overlap the carrier passage areas Rcp in the plan view. Note that after the light receiving elements 32 and carrier absorbing portions 80 are formed, the wiring layer 50, color filters 60, and lens portions 70 are formed at typical steps.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: substrate; 20: element forming portion; 22: element isolating portion; 30: pixel portion; 32: light receiving element; 41: first wall portion; 42: second wall portion; 50: wiring layer; 55: wiring portion; 60: color filter; 70: lens portion; 80: carrier absorbing portion; 100: imaging device; 500: imaging device; 510: substrate; 520: element forming portion; 530: pixel portion; 532: light receiving element; 541: wall portion; 550: wiring layer; 555: wiring portion; 560: color filter; 570: lens portion; 580: floating diffusion layer

What is claimed is:

1. An imaging device comprising:
a first-conductivity-type substrate;
a first-conductivity-type element forming portion that is provided on the substrate, and has a concentration lower than the substrate; and
a plurality of pixel portions that are provided in the element forming portion, and are arrayed two-dimensionally, each pixel portion having a light receiving element, and a second-conductivity-type carrier absorbing portion provided in an area different from an area where the light receiving element is provided, wherein
at least one pixel portion of the plurality of pixel portions has:
a first-conductivity-type first wall portion provided on a substrate side relative to the light receiving element, the first wall portion overlapping at least part of the light receiving element in an array direction of the plurality of pixel portions, and having a concentration higher than the substrate, and
a carrier passage area not provided with the first wall portion in the array direction of the plurality of pixel portions.

2. The imaging device according to claim 1, wherein the carrier passage area overlaps at least part of the carrier absorbing portion in the array direction of the plurality of pixel portions.

3. The imaging device according to claim 1, wherein the first wall portion is provided in the substrate.

4. The imaging device according to claim 3, wherein the first wall portion is provided in the substrate at a boundary thereof with the element forming portion.

5. The imaging device according to claim 1, further comprising a second wall portion that is provided in the element forming portion, extends inclined to the array direction of the plurality of pixel portions, and has a concentration higher than the element forming portion.

6. The imaging device according to claim 5, wherein one end of the second wall portion is positioned opposite to the substrate relative to a position of an end of the carrier absorbing portion closer to the substrate.

7. The imaging device according to claim 5, further comprising an element isolating portion that is provided on a side in the element forming portion opposite to the substrate, and is provided adjacent to the carrier absorbing portion in a plan view, wherein
the second wall portion is provided in contact with the element isolating portion.

8. The imaging device according to claim 5, wherein the concentration of the first wall portion is higher than the concentration of the second wall portion.

9. The imaging device according to claim 1, wherein
a plurality of the first wall portions are provided, the plurality of first wall portions being stacked one on another, and
the plurality of first wall portions have areas that decrease in width as a distance from the light receiving element toward the substrate increases.

10. The imaging device according to claim 1, wherein the carrier absorbing portion includes at least one of a floating diffusion, a source or drain of a selection transistor, a source or drain of a reset transistor, a source or drain of an amplification transistor, a source or drain of a switch interconnecting a plurality of floating diffusions, and a diffusion area of a power supply.

11. The imaging device according to claim 1, wherein the carrier absorbing portion is set to a predetermined potential.

12. An imaging device comprising:
a substrate;
an element forming portion provided on the substrate; and
a plurality of pixel portions that are arrayed two-dimensionally in at least one of the substrate and the element forming portion, each pixel portion having a light receiving element, wherein
at least one pixel portion of the plurality of pixel portions has a first wall portion provided on a substrate side relative to the light receiving element, the first wall portion overlapping at least part of the light receiving element in the array direction of the plurality of pixel portions, and having a concentration higher than the substrate.

13. The imaging device according to claim 12, wherein
the plurality of pixel portions each have a carrier absorbing portion provided in an area different from an area where the light receiving element is provided,
the at least one pixel portion has a carrier passage area not provided with the first wall portion in the array direction of the plurality of pixel portions, and
the carrier passage area is provided to overlap at least part of the carrier absorbing portion in the array direction of the plurality of pixel portions.

14. The imaging device according to claim 13, wherein
the substrate and the element forming portion are of the same conductivity type,
the element forming portion has a concentration lower than the substrate, and
the carrier absorbing portion is of a conductivity type different from the conductivity type of the substrate and the element forming portion.

15. An imaging device manufacturing method comprising:
preparing a first-conductivity-type substrate;
forming a first-conductivity-type element forming portion on the substrate, the element forming portion having a concentration lower than the substrate;
forming a first-conductivity-type first wall portion and a carrier passage area in the substrate or the element forming portion, the first wall portion having a concentration higher than the substrate, the carrier passage area being not provided with the first wall portion; and
forming a light receiving element and a second-conductivity-type carrier absorbing portion in the element forming portion such that a plurality of pixel portions are two-dimensionally arrayed, the carrier absorbing portion being provided in an area different from an area where the light receiving element is provided, each pixel portion having the light receiving element and the carrier absorbing portion, wherein
at least one pixel portion of the plurality of pixel portions includes the light receiving element formed to overlap at least part of the first wall portion in the array direction of the plurality of pixel portions.

16. The imaging device manufacturing method according to claim 15, further comprising, after forming the element forming portion on the substrate, forming a second wall portion in the element forming portion, the second wall portion having a concentration higher than the substrate.

17. The imaging device manufacturing method according to claim 16, comprising repeating multiple times: forming the element forming portion on the substrate; and
forming the second wall portion in the element forming portion.

18. An imaging device manufacturing method comprising:
preparing a substrate;
forming an element forming portion on the substrate;
forming a first wall portion in at least one of the substrate and the element forming portion, the first wall portion having a concentration higher than the substrate; and
two-dimensionally arraying a plurality of pixel portions in the element forming portion, each pixel portion having a light receiving element, wherein
at least one pixel portion of the plurality of pixel portions has the light receiving element formed to overlap at least part of the first wall portion in the array direction of the plurality of pixel portions.

* * * * *